United States Patent [19]

Miller et al.

[11] Patent Number: 4,962,325

[45] Date of Patent: Oct. 9, 1990

[54] SAMPLE-HOLD AMPLIFIER CIRCUIT

[75] Inventors: Gerald Miller, Hudson, N.H.; Christopher O'Connor, Methuen, Mass.

[73] Assignee: Analog Devices, Inc.

[21] Appl. No.: 412,599

[22] Filed: Sep. 26, 1989

Related U.S. Application Data

[63] Continuation of Ser. No. 242,886, Sep. 9, 1988, abandoned.

[51] Int. Cl.$^5$ .............................................. G11C 27/02
[52] U.S. Cl. ................................... 307/353; 307/494; 328/151
[58] Field of Search ....................... 307/353, 491, 494; 328/151

[56] References Cited

U.S. PATENT DOCUMENTS

| | | | |
|---|---|---|---|
| 4,570,080 | 2/1986 | Swanson | 307/353 |
| 4,604,584 | 8/1986 | Kelley | 330/9 |
| 4,672,239 | 6/1987 | Thommen | 328/151 |
| 4,779,012 | 10/1988 | Moscovici | 307/353 |

OTHER PUBLICATIONS

P. Henry, JFET-Input Amps are Unrivaled for Speed and Accuracy; Electrical Design News, vol. 32, No. 10, pp. 161-169, May 14, 1987.

L. Kunsagi et al., Buffer-Based Switched-Capacitor Gain Stages, Electronics Letters, vol. 24, No. 5, pp. 254-255, Mar. 3, 1988.

Martin et al., "A Differential Switched-Capacitor Amplifier", *IEEE Journal of Solid-State Circuit*, SC-22, no. 1, Feb. 1987, pp. 104-106.

Gasperik, "An Autozeroing Sample & Hold IC," 1980, IEEE International Solid-State Circuits Conference, Digest of Technical Papers, pp. 132-133, 2/1980.

*Primary Examiner*—John Zazworsky
*Attorney, Agent, or Firm*—Wolf, Greenfield & Sacks

[57] ABSTRACT

An auto-zeroing sample-hold amplifier capable of tracking an input voltage and, when designated, sampling and accurately holding an input voltage with no gain or offset errors includes input and output buffers with complementary, equal-magnitude offsets for minimizing offset voltage errors. An input voltage is sampled across a primary hold capacitor as well as a secondary hold capacitor [at the amplifier output to] in a sample mode. In a hold mode, the capacitors, in conjunction with the buffers and a transconductance amplifier, form a negative feedback loop around the transconductance amplifier to hold the sampled voltage and reduced voltage excursions at the output of the sample-hold amplifier. A special cancellation switch and capacitor are included for differentially cancelling voltage errors caused by switch charge feed-through onto the primary hold capacitor.

10 Claims, 6 Drawing Sheets

S/H AMPLIFIER

SAMPLE-HOLD AMPLIFIER CIRCUIT

This application is a continuation, of application Ser. No. 07/242,886, filed 9/9/88, now abandoned.

FIELD OF THE INVENTION

The present invention relates to the field of data-acquisition systems, and more specifically to sample-hold (or sample-and-hold) amplifiers (SHAs). The present invention provides an auto-zeroing sample-hold amplifier that inherently corrects for internal amplifier errors.

BACKGROUND OF THE INVENTION

Sample-hold amplifiers are well known in the electronics industry. As the name implies, a sample-hold amplifier has two steady-state operating modes. In the sample-, or track-, mode, the output of an SHA tracks the input as precisely as possible until the hold-mode is initiated. In the hold mode, the output of the SHA retains the value of the input signal at the time the hold-mode was initiated.

Although few circuit components are required for a basic sample-hold amplifier, accurate holding of the sampled input voltage requires a more sophisticated architecture. FIGS. 1, 2, 3 and 4 illustrate some exemplary prior art embodiments of sample-hold amplifiers; many others exist. These exemplary prior art sample-hold circuits employ the technique of auto-zeroing to reduce output errors due to input offsets. In sample-hold applications, auto-zeroing is a method of compensating for errors introduced by the voltage offsets of amplifiers within the circuit. Typically, the offset error of an transconductance amplifier is sampled in the sample-mode of operation. A similar offset value is then added to the output voltage in the hold-mode to negate the offset error. In the prior art circuits listed above, auto-zeroing is used to force the output voltage of the circuit to equal the sampled input voltage. The architecture and performance of these circuits, however, have undesirable drawbacks which limit their utility.

FIG. 1 is a schematic diagram of a simplified auto-zeroing sample-hold amplifier. This sample-hold amplifier requires a high gain/low offset tranconductance amplifier and exhibits poor settling behavior from the return to zero requirement at the circuit output.

FIG. 2 is a schematic diagram of an auto-zeroing sample-hold amplifier which is capable of simultaneous acquisition of an analog signal and storage of a previously sampled signal. This sample-hold amplifier exhibits poor dynamic behavior, requires a high gain/low offset output amplifier and is too complex to be implemented monolithically. Furthermore, the output of the sample-hold amplifier does not track the voltage input.

FIG. 3 is a schematic diagram of a differential switched-capacitor amplifier which contains amplifier offset voltage cancellation. As with the SHA of FIG. 2, this amplifier exhibits poor dynamic behavior, requires a high gain amplifier, and the amplifier output does not track the voltage input.

FIG. 4 is a schematic diagram of an auto-zeroing sample-hold amplifier which exhibits good circuit performance but, as with the SHA of FIG. 2 is unduly complex.

It is therefore an object of the present invention to provide a sample-hold amplifier for use in sampling analog signals, which corrects internal amplifier offset and gain errors, without the need for the amplifier output to return to zero.

Another object of the present invention is to provide a sample-hold amplifier in which the circuit output tracks the voltage input.

A further object of the present invention is to provide a sample-hold amplifier which uses simple low precision amplifiers which do not require high gain or low offsets.

Another object of the present invention is to provide a sample-hold amplifier which has a fast acquisition time.

Yet another object of the present invention is to provide a sample-hold amplifier which has low power consumption and requires little area for integration.

Other objects of the invention will be in part obvious and will in part appear hereinafter.

BRIEF SUMMARY OF THE INVENTION

The foregoing and other objects of the present invention are achieved with an improved sample hold amplifier in which the circuit output tracks the voltage input, and, in response to a command signal, samples and accurately holds the sampled input voltage at the amplifier output. In the SHA of the present invention, both the input and the output are buffered, and the input voltage is sampled not only across a primary "hold" capacitor, but also across a secondary "hold" capacitor at the output of the amplifier, so as to reduce voltage excursions at the output of the circuit due to buffer offsets. The input and output buffers introduce complementary, equal magnitude offset voltages which, together with a unique feedback arrangement to control charging of the output amplifier capacitor, enables auto-zeroing of internal amplifier offset errors.

According to one embodiment of the present invention, an improved sample-hold amplifier includes an input switch, a feedback switch, primary and secondary sampling switches, input and output buffers, primary and secondary hold capacitors, a compensation capacitor, and a transconductance amplifier.

The sample-hold amplifier of the present invention operates in two modes, the sample-mode and the hold-mode.

During the sample-mode, the input switch, and the primary and secondary sampling switches are closed. The feedback switch is open. The transconductance amplifier provides the primary and secondary hold capacitors with a virtual ground, enabling the circuit output to track the voltage input through a signal path defined by the input buffer, the secondary sampling switch, and the output buffer. When a Hold command is asserted, a transition from the sample-mode to the hold-mode is initiated. First, the primary sampling switch is opened, causing the input voltage to be sampled across the primary hold capacitor. Next, the secondary sampling switch is opened, causing the input voltage to be sampled across the secondary hold capacitor. Finally, the input switch is opened, disconnecting the entire circuit from the input voltage, and the feedback switch is closed, completing the feedback loop around the transconductance amplifier. The circuit is now in the hold-mode.

In the hold-mode, the transconductance amplifier provides some voltage gain, with a negative feedback loop which includes, in series, the secondary hold capacitor, the output buffer, the feedback switch, the input buffer, and the primary hold capacitor. Assuming ideally that the input and output buffers and the transconductance amplifier have no offset voltages, the exact input voltage is held on the primary and secondary hold capacitors. Upon entering the hold-mode, the output voltage of the circuit would automatically equal the sampled input voltage stored on the primary and secondary hold capacitors without any error compensation required of the transconductance amplifier. Realistically, the voltage offsets from the input buffer and transconductance amplifier will be sampled onto the primary hold capacitor along with the input voltage. Once in the hold-mode, the transconductance amplifier forces the output voltage to equal the sampled input voltage, by correcting any offset errors.

The invention will be more fully understood from the detailed description set forth below, which should be read in conjunction with the accompanying drawings. The invention is defined in the claims appended at the end of the detailed description, which is offered by way of example only.

DETAILED DESCRIPTION

Figure 1:
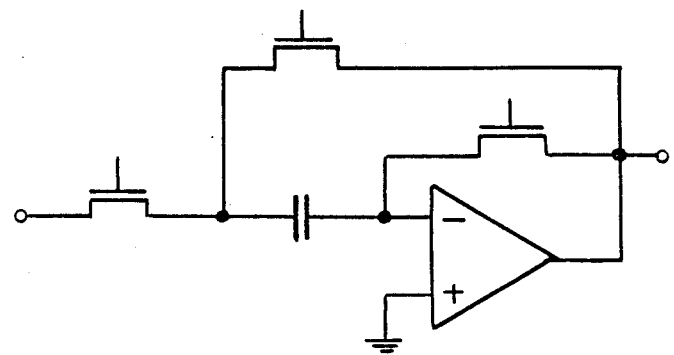
FIG. 1 is a schematic circuit diagram for a prior art implementation of an auto-zeroing sample-hold amplifier.
Figure 3:
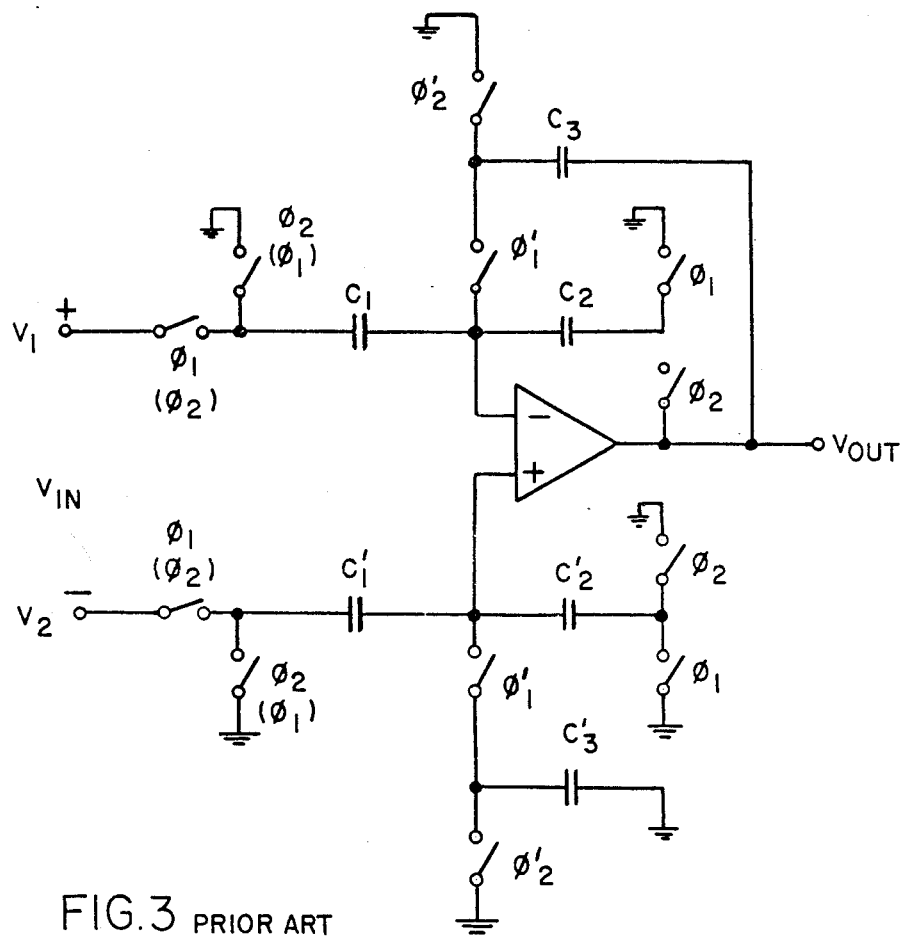
FIG. 3 is a schematic circuit diagram of a prior art differential switched-capacitor amplifier.
Figure 2:
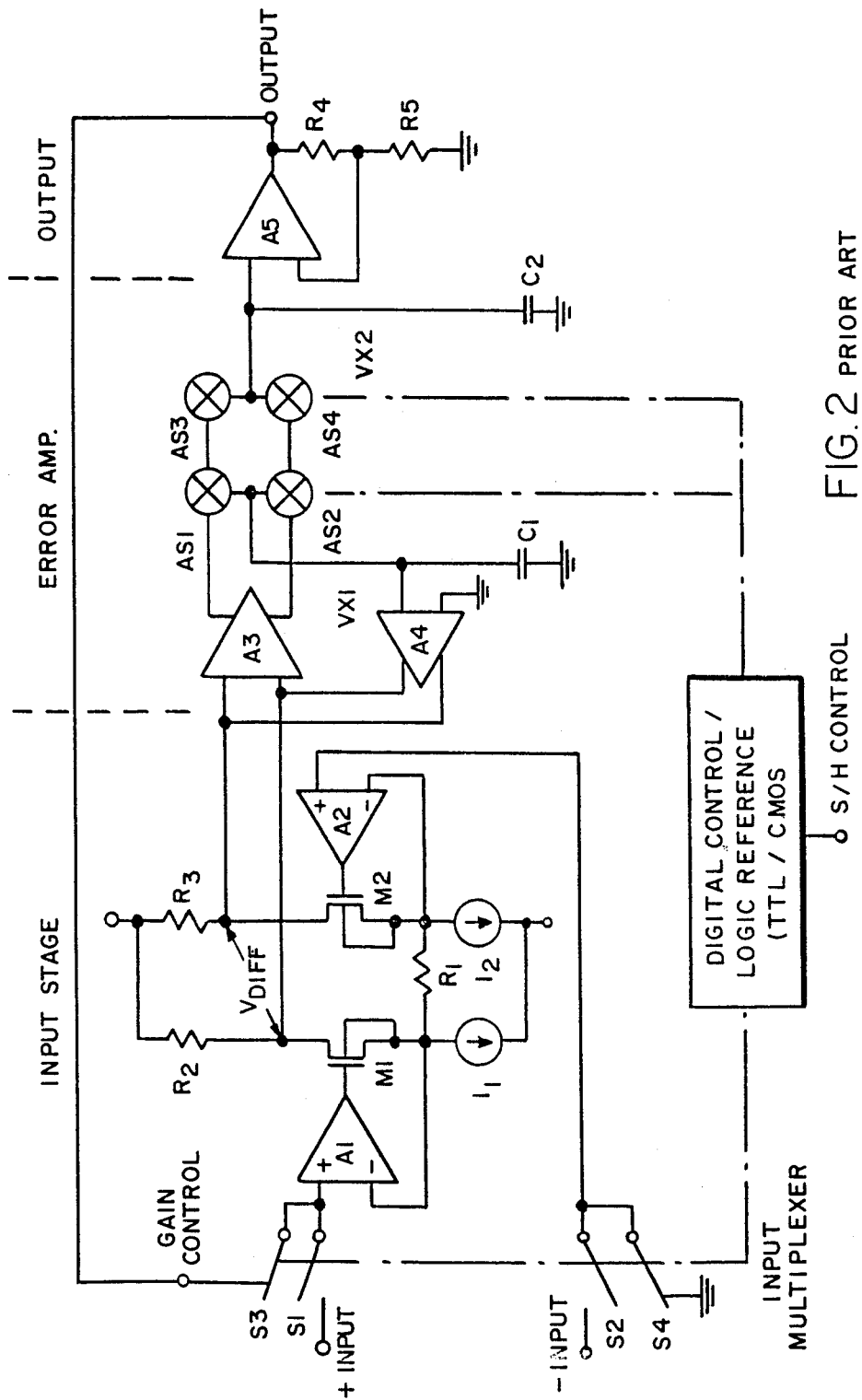
FIG. 2 is a schematic circuit diagram for a prior art auto-zeroing sample-hold amplifier which is capable of simultaneously sampling an analog signal while storing the previously sampled signal.
Figure 4:
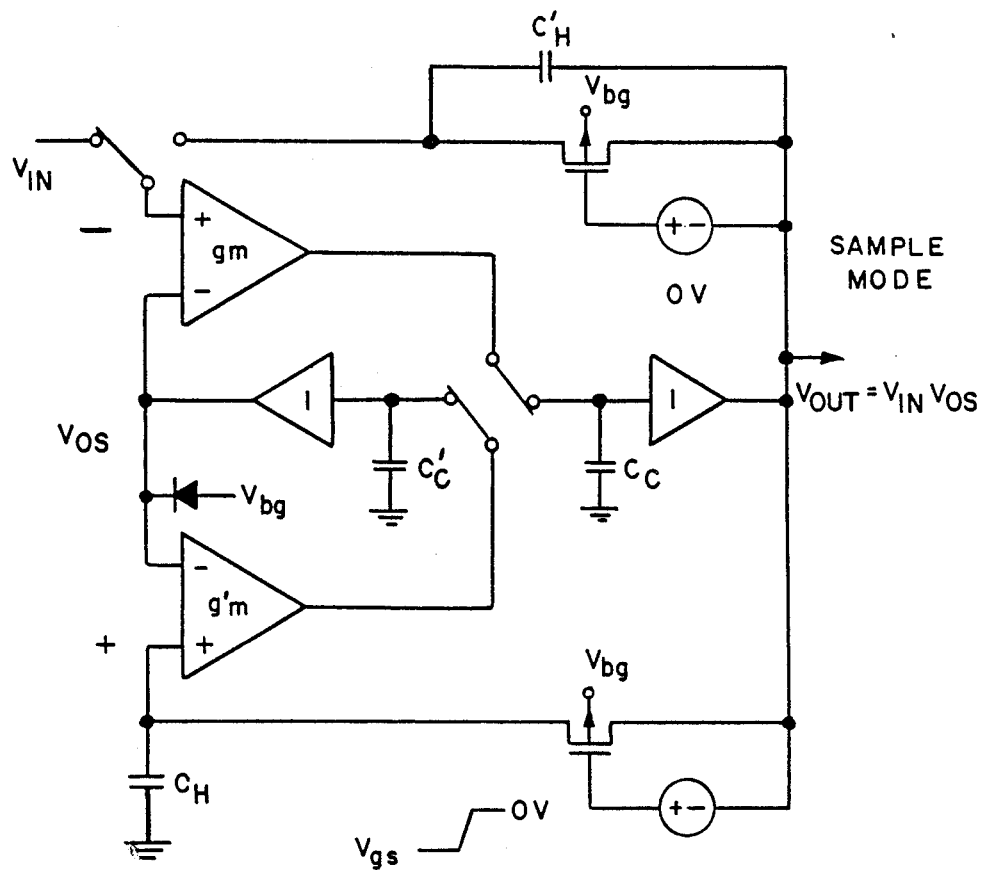
FIG. 4 is a schematic circuit diagram for yet another embodiment of a prior art sample-hold amplifier.
Figure 5:
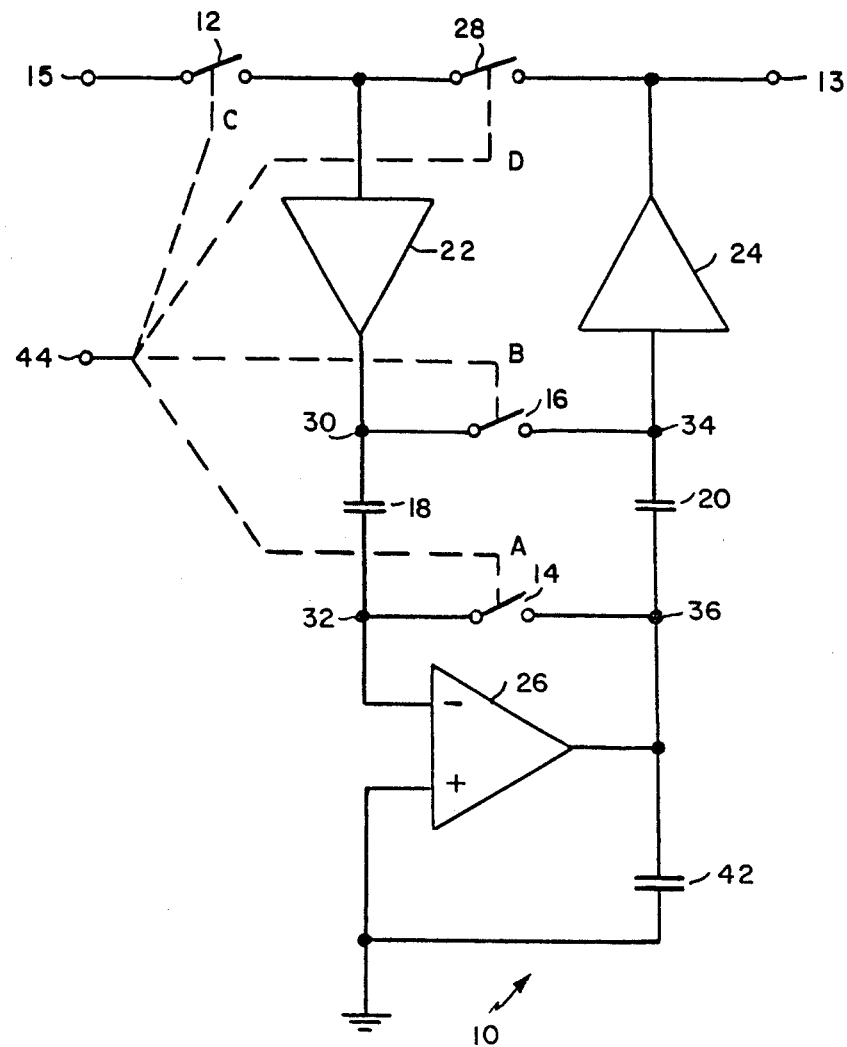
FIG. 5 is a schematic circuit diagram of the fundamental embodiment of the sample-hold amplifier of the present invention.

Referring to the drawings, and in particular FIG. 5, a basic implementation of an improved sample-hold amplifier 10 is shown. SHA 10 comprises input terminal 15, output terminal 13, control terminal 44, input switch 12, input buffer 22, output buffer 24, primary sample switch 14, secondary sample switch 16, primary hold capacitor 18, secondary hold capacitor 20, feedback switch 28, compensation capacitor 42, and amplifier 26.

The input switch 12 is connected between the input terminal 15 and the input of input buffer 22. The output of input buffer 22 is connected to a first electrode of primary hold capacitor 18; the second electrode of capacitor 18 is connected to the inverting input terminal of amplifier 26. The output terminal of amplifier 26 is connected to a first lead of secondary hold capacity 20; the second lead of capacitor 20 is, in turn, connected to the input of output buffer 24. The output of output buffer 24 provides, at terminal 13, the output of the sample-hold amplifier circuit 10.

The non-inverting terminal of amplifier 26 is connected to ground. The output terminal of amplifier 26 is also connected to a first electrode of compensation capacitor 42; the second electrode of compensation capacitor 42 is connected to ground. The Sample/Hold command signal is applied to control terminal 44 and in response appropriate control signals (see FIG. 9) are supplied to the switches by control circuitry which is not shown but which will be obvious to electrical engineers. The control signals, shown in dotted lines on FIG. 5, which dictate the state of switches 14, 16, 12, and 28, are designated as A, B, C, and D, respectively.

Switches 14, 16, and 28 are further included for reconfiguring sample-hold amplifier 10. Primary sample switch 14 is connected between the inverting input terminal and output terminal of transconductance amplifier 26. Secondary sampling switch 16 is connected across the output of input buffer 22 and the input of output buffer 24. Finally, feedback switch 28 is connected between the input of input buffer 22 and the output of output buffer 24.

Sample-hold amplifier 10 has two steady-state modes of operation, the sample-mode and the hold-mode. A discussion of each mode of operation follows. To facilitate the explanation of the circuit's operation, several nodes in the circuit are given reference numerals.

Figure 6:
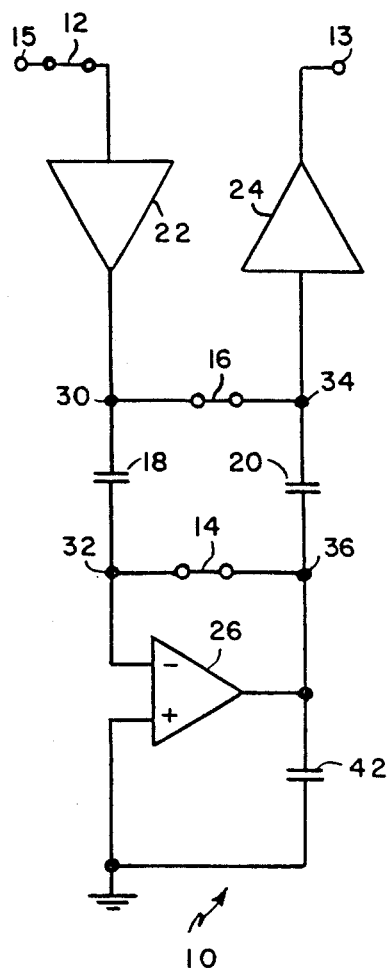
FIG. 6 is a schematic circuit diagram illustrating the configuration of the sample-hold amplifier of FIG. 5 in the sample-mode of operation.

FIG. 6 illustrates the configuration of the sample-hold amplifier 10 of FIG. 5 in the sample-mode of operation. In the sample-mode, the Sample/Hold signal applied to control terminal 44 is high. Feedback switch 28 is in the open position. Input switch 12, primary sampling switch 14 and secondary sampling switch 16 are closed. Input switch 12 connects the sample-hold amplifier 10 to the input voltage.

In the sample-mode configuration, the voltage output of sample-hold amplifier 10 tracks the voltage input through the signal path comprised of input terminal 15, input switch 12, input buffer 22, secondary sampling switch 16, output buffer 24, and output terminal 13. Amplifier 26, in the sample-mode, acts as a transconductance amplifier which, with its non-inverting terminal tied to ground, ideally appears to the "bottom" electrodes of primary hold capacitor 18 and secondary hold capacitor 20 as a virtual ground. Realistically, because transconductance amplifier 26 is in a feedback configuration via primary sampling switch 14, an offset voltage will appear at the inverting terminal of the transconductance amplifier, thereby forcing the voltage at nodes 32 and 36 to equal the offset voltage of transconductance amplifier. Nodes 30 and 34 are driven by input buffer 22 to a voltage equal to the input voltage minus an offset value for buffer 22.

Figure 9:
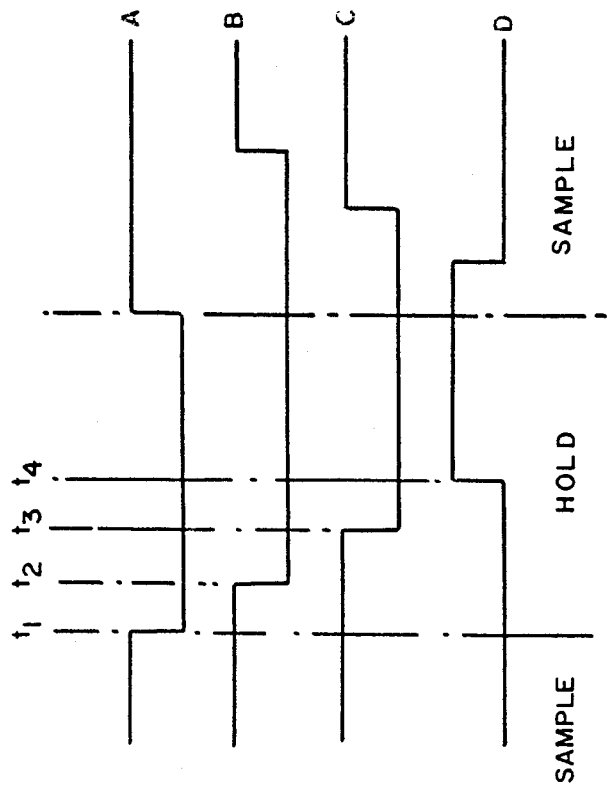
FIG. 9 is timing diagram illustrating the signal levels of various control signals used to control the modes of the sample-hold amplifier of the present invention.

A transition of the signal at control terminal 44 from high to low initiates the transition of sample-hold amplifier 10 from the sample-mode to the hold-mode. FIG. 9 is a timing diagram illustrating the control signals used to reconfigure the circuit. At time $t_1$, conincident with the high-to-low transition of control signal A, primary sampling switch 14 is opened. At the instant that primary sampling switch 14 is opened, a charge is trapped on primary hold capacitor 18, and the voltage at node 30 is sampled across the capacitor. At time $t_2$, coincident with the high to low transition of control signal B, secondary sampling switch 16 is opened. The instant secondary sampling switch 16 is opened, a charge is trapped on secondary hold capacitor 20, and the voltage present at node 34 is sampled across the secondary hold capacitor. The voltages sampled across the primary and secondary hold capacitors is equal to the input voltage plus some offset errors.

The offset voltage of an amplifier is defined as the residual voltage to which a potential difference between the input terminals of the amplifier is driven by negative feedback and is designated as $V_{os}$. The input voltage to SHA 10 is designated as $V_{in}$. Where the offset voltages for input buffer 22, output buffer 24 and amplifier 26 are designated as $V_{os1}$, $V_{os2}$, and $V_{os3}$ respectively, the sampled input voltage across primary hold capacitor 18 ($V_{CH}$) equals:

$$V_{CH} = V_{in} + V_{os1} - V_{os3} \quad (1)$$

Once the input voltage is sampled across primary hold capacitor 18 and secondary hold capacitor 20, the sample-hold amplifier can be disconnected from the input voltage and reconfigured to compensate for offset errors. Accordingly, at time $t_3$, coincident with the high-to-low transition of control signal C, input switch 12 is opened, thereby disconnecting sample-hold amplifier 10 from the input voltage at input terminal 15. At time $t_4$, coincident with the low-to-high transition of control signal B, feedback switch 28 is closed, completing the transition of sample-hold amplifier 10 from the sample-mode to the hold-mode. Switches 14, 16 and 28 function as voltage transfer elements, operative during a first, or sample mode, for operatively transferring an input voltage to the output of the sample-hold amplifier and for sampling the input voltage across the primary and secondary capacitors (i.e., charge storage means), and further operative during a second, or hold mode, for operatively forcing the voltage across the secondary capacitor to equal the voltage sampled across the primary hold capacitor in the sample mode.

Figure 7:
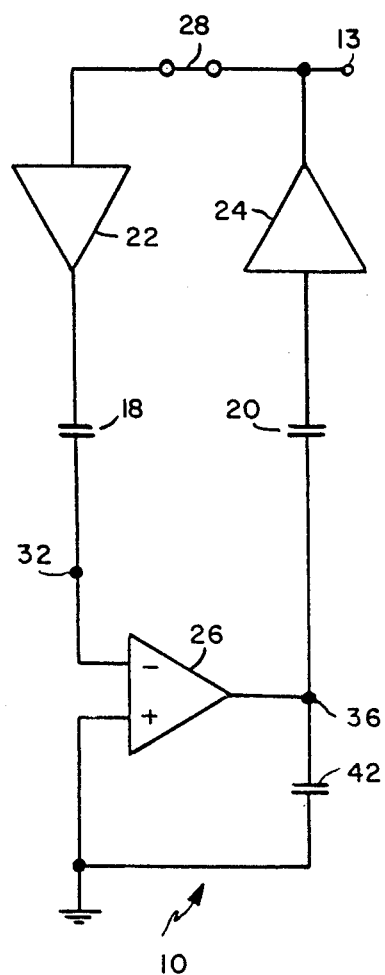
FIG. 7 is a schematic circuit diagram illustrating the conceptual configuration of the sample-hold amplifier of FIG. 5 in the hold-mode of operation.

FIG. 7 illustrates the configuration of the sample-hold amplifier of FIG. 5 in the hold-mode of operation. In the hold-mode, the feedback loop of transconductance amplifier 26 includes secondary hold capacitor 20, output buffer 24, feedback switch 28, input buffer 22, and primary hold capacitor 18. In the hold-mode, amplifier 26 changes its function from a transconductance amplifier to a voltage amplifier, to compensate for offset voltages from itself and the input and output buffers.

Assuming ideally that amplifier 26, input buffer 22 and output buffer 24 had zero offset voltages, then the voltage sampled across primary hold capacitor 18 and secondary hold capacitor 20 would be exactly equal to the input voltage at the time of sampling. Upon opening the input switch and closing the feedback switch, the output voltage will equal the input voltage without any compensation or level-shifting required of the voltage amplifier 26.

Realistically, offset voltages are introduced into the voltage sampled across the primary and secondary hold capacitors, as shown by equation 1. The voltage errors sampled along with the input voltage are now subtracted in the hold-mode loop. In the hold-mode, the output voltage is required to change an amount equal to the sum of the offset voltages of input buffer 22 and output buffer 24.

Where $A_v$ equals the gain of voltage amplifier 26, the inverting input of voltage amplifier 26 is required to move voltage error amount ($V_E$) equal:

$$V_E = (V_{os1} + V_{os2})/A_V \quad (2)$$

By designing input buffer 22 and output buffer 24 with complementary offset voltages of equal magnitude, the voltage error $V_E$ can be made negligibly small. When $V_E$ is negligible, little movement is required of voltage amplifier 26 which forces the output voltage of sample-hold amplifier 10 to equal the sampled input voltage.

Assuming that no charge injection error is introduced onto the primary hold capacitor 18 by input switch 12, a sample-hold amplifier 10, built as described above, can, to the first order, sample and hold exact input voltages. Realistically, second order effects such as charge injection errors will modify the performance of the present invention.

Figure 8:
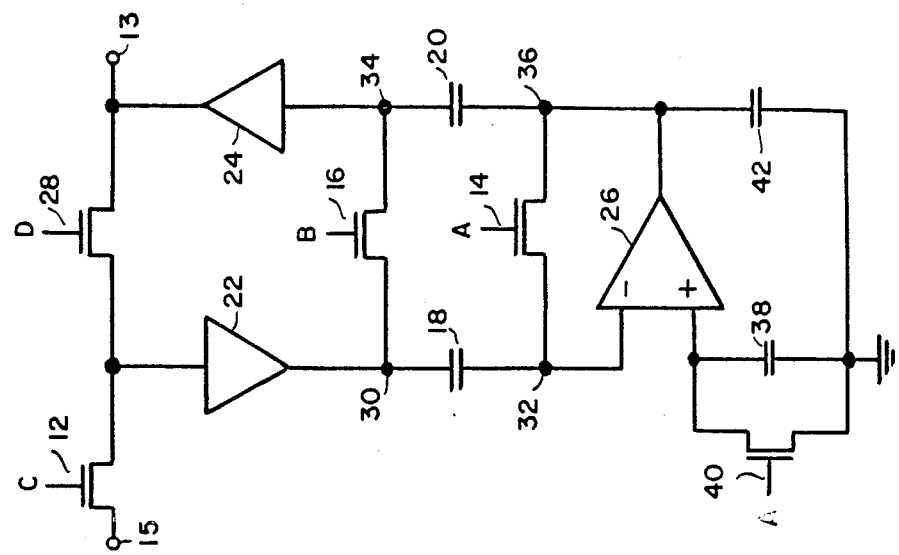
FIG. 8 is a schematic circuit diagram of a more complete architecture of the sample-hold amplifier of FIG. 5 including additional circuitry for cancellation of injection charges.

Referring now to FIG. 8, a more complete architecture useful for implementing sample-hold amplifier 10 is illustrated. A cancellation switch 40 and cancellation capacitor 38 are connected in parallel between the non-inverting input terminal of transconductance amplifier 26 and ground. By simultaneously controlling cancellation switch 40 and primary sampling switch 14 with control signal A, the voltage errors caused by switch charge feed-through onto the primary hold capacitor 18 may be differentially cancelled. A dominant pole compensation capacitor 42 is further included in FIG. 8. Upon opening of primary and secondary sampling switches node 36 is prevented from moving quickly by compensation capacitor 42, insuring that the sample on the secondary hold capacitor will approximate the sample on the primary hold capacitor if the interval between the samples is short. Compensation capacitor 42 further prevents the transconductance amplifier 26 from oscillating. The switches of sample-hold amplifier 10 are implemented with MOS transistors in FIG. 8, whereas they are simply shown by the functional switch symbol in FIGS. 5, 6 and 7 without regard to implementation details.

In the preferred embodiment, sample-hold amplifier 10 is implemented monolithically using a BiCMOS fabrication process. In the preferred embodiment, all switches are implemented with PMOS-NMOS pairs, except for the primary sampling switch 14 and cancellation switch 40, which are NMOS devices of small size for reduced charge feed through. When implemented monolithically, as many as four independently controlled sample-hold amplifiers may be fabricated onto a chip with each sample-hold amplifier occupying less than 2300 square mils.

An auto-zeroing sample-hold amplifier 10, constructed as described above, is capable of tracking an input voltage and, when indicated, sampling and accurately holding an input voltage without significant gain or offset errors. Furthermore, the present invention can be implemented monolithically to achieve acquisition times of 500 nanoseconds, power consumption of 75 mW, and space consumption of less than 2300 sq. mils.

Having thus described one particular embodiment, various alterations, modifications and improvements will readily occur to those skilled in the art. Such alterations, modifications and improvements as are made obvious by this disclosure are intended to be part of this disclosure, although not expressly stated herein, and are intended to be in the spirit and scope of the invention. Accordingly, the foregoing description is intended to be exemplary only, and not limiting. The invention is limited only as defined in the following claims and equivalents thereto.

What is claimed is:

1. A sample-hold amplifier circuit for sampling a voltage applied to an input of the circuit and for selectively holding the sampled input voltage to provide the same to an output of the circuit, said circuit comprising:
   an input buffer, having an output terminal, and an input terminal attached to said input of the circuit, for driving said input voltage to the remainder of the circuit;
   a primary hold capacitor, having a first electrode connected to the output terminal of said input buffer, for storage of said sampled input voltage;
   an amplifier, having an output terminal, an inverted input terminal connected to a second electrode of said primary hold capacitor, and a non-inverting input terminal attached to ground;
   a secondary hold capacitor having a first electrode attached to the output terminal of said amplifier;
   an output buffer having an input terminal connected to a second electrode of the secondary hold capacitor, and an output terminal providing the output for said circuit;
   a primary sampling switch connected between the inverting input terminal of said amplifier and the output terminal of said amplifier;
   a secondary sampling switch connected between the output terminal of said input buffer and the input terminal of said output buffer; and
   a feedback switch connected between the input terminal of said input buffer and the output terminal of the output buffer.

2. A sample-hold amplifier circuit for sampling a voltage applied to an input of the circuit and for selectively holding the sampled input voltage to provide the same to an output of the circuit, said circuit comprising;
   an input buffer means, having an output, and an input connected to the input of the circuit;
   a first charge storage means, having a first lead connected to the output of said input buffer means;
   an amplifier means, having an output, a first input connected to a second lead of said first charge storage means, and a second input attached to ground;
   a second charge storage means, having a first lead connected to the output of said amplifier means and a second lead for providing the output of the circuit; and
   a voltage transfer means, operative during a first mode of operation, for operatively transferring said input voltage to the output of said circuit and for sampling said input voltage across the first and second charge storage means, said voltage transfer means, operative during a second mode of operation, for operatively forcing the voltage across the second charge storage means to egual the voltage sampled across said first charge storage means in said first mode.

3. The sample-hold amplifier of claim 2 further comprising an output buffer means, having an input connected to the second lead of the second charge storage means, and an output for providing the output of the circuit.

4. The sample-hold amplifier of claim 3 in which said voltage transfer means comprises:
   a first switch means for selectively connecting the output of said amplifier means to the first input of said amplifier means, and a second switch means for selectively connecting the output of said input buffer means to the input of said output buffer means, when said voltage transfer means is in said first mode of operation.

5. The sample-hold amplifier of claim 3 in which said voltage transfer means further comprises:
   feedback switch means for selectively connecting the output of said output buffer means to the input of said input buffer means when said voltage transfer means is in said second mode of operation.

6. The sample-hold amplifier of claim 3 in which said input buffer means and said output buffer means have complementary offset voltages of egual magnitude.

7. The sample-hold amplifier of claim 2 in which said first charge storage means is a capacitor.

8. The sample-hold amplifier of claim 2 in which said second charge storage means is a capacitor.

9. The sample-hold amplifier of claim 2 in which the first input of said amplifier means is an inverting input.

10. The sample-hold amplifier of claim 2 in which the second input of said amplifier means is a non-inverting input.

* * * * *